(12) United States Patent
Cruise

(10) Patent No.: US 7,990,276 B2
(45) Date of Patent: Aug. 2, 2011

(54) BATTERY IDENTIFICATION FOR BATTERY PACKS WITH INTER-CELL TAPS

(75) Inventor: Nathan Cruise, Phoenix, MD (US)

(73) Assignee: Black & Decker Inc., Newark, DE (US)

( * ) Notice: Subject to any disclaimer, the term of this patent is extended or adjusted under 35 U.S.C. 154(b) by 391 days.

(21) Appl. No.: 12/351,200

(22) Filed: Jan. 9, 2009

(65) Prior Publication Data

US 2009/0174563 A1    Jul. 9, 2009

Related U.S. Application Data

(60) Provisional application No. 61/010,544, filed on Jan. 9, 2008.

(51) Int. Cl.
*G08B 21/00*    (2006.01)

(52) U.S. Cl. .................................. 340/636.2; 320/107

(58) Field of Classification Search ............... 340/636.2; 320/107, 108; 429/7, 96, 99
See application file for complete search history.

(56) References Cited

U.S. PATENT DOCUMENTS

| | | | | |
|---|---|---|---|---|
| 3,713,895 A | * | 1/1973 | Consolloy | 429/116 |
| 3,773,561 A | * | 11/1973 | Bjorkman | 429/51 |
| 4,315,364 A | * | 2/1982 | Leffingwell | 29/623.1 |
| 4,482,614 A | * | 11/1984 | Zito, Jr. | 429/70 |
| 5,015,546 A | * | 5/1991 | Dulaney et al. | 429/99 |
| 6,586,909 B1 | * | 7/2003 | Trepka | 320/108 |
| 2008/0309286 A1 | * | 12/2008 | Hoff | 320/107 |

* cited by examiner

*Primary Examiner* — John A Tweel, Jr.
(74) *Attorney, Agent, or Firm* — Harness, Dickey & Pierce, P.L.C.

(57) ABSTRACT

A battery charger comprises a first electrical contact that receives a positive contact of an attached battery pack; a second electrical contact that receives a negative contact of the attached battery pack; a plurality of inter-cell electrical contacts that selectively receive inter-cell contacts of the attached battery pack; a measurement module; and a control module. The inter-cell contacts of the attached battery pack are connected to nodes between cells of the attached battery pack.

20 Claims, 9 Drawing Sheets

BATTERY IDENTIFICATION FOR BATTERY PACKS WITH INTER-CELL TAPS

CROSS-REFERENCE TO RELATED APPLICATIONS

This application claims the benefit of U.S. Provisional Application No. 61/010,544, filed on Jan. 9, 2008. The disclosure of the above application is incorporated herein by reference in its entirety.

FIELD

The present disclosure relates to detecting voltage and identifying battery pack characteristics for battery packs with multiple cell taps.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1, a functional block diagram of a battery pack 100 according to the prior art is presented. The battery pack 100 includes multiple cells 106-1, 106-2, 106-3, and 106-4, each having a positive and a negative terminal. The cells 106 are connected in series, with the positive terminal of one of the cells 106 connected to the negative terminal of a next one of the cells 106. In various implementations, the cells 106 may be lithium ion (LiIon) charge storage cells.

The negative terminal of the cell 106-4 is connected to an external contact, which may interface with a power tool or a charger. The positive terminal of the cell 106-1 is connected to a switch 110. When the switch 110 is conducting, the positive terminal of the cell 106-1 is connected to an external contact, which may interface with the power tool or the charger. The switch 110 is controlled by a protection system 114. The protection system 114 monitors voltages at the positive and negative terminals of each of the cells 106.

The cells 106 may have varying charge storage capacities. The cells 106 with lower charge storage capacities will decrease in voltage faster than the cells 106 with larger storage capacities. The protection system 114 measures the voltages of the cells 106 and instructs the switch 110 to stop conducting when the voltage of one of the cells becomes too low. In addition, the switch 110 may stop conducting if the current flowing through it exceeds a safe operating level.

SUMMARY

A battery charger comprises a first electrical contact that receives a positive contact of an attached battery pack; a second electrical contact that receives a negative contact of the attached battery pack; a plurality of inter-cell electrical contacts that selectively receive inter-cell contacts of the attached battery pack; a measurement module; a control module; and a light source. The inter-cell contacts of the attached battery pack are connected to nodes between cells of the attached battery pack.

The measurement module comprises a multiplexer that connects a selected one of the first and second electrical contacts and the plurality of inter-cell electrical contacts to an output terminal; an analog to digital converter that receives contact voltages from the output terminal of the multiplexer and digitizes the contact voltages; a voltage determination module that determines cell voltages of each of the cells of the attached battery pack based on the digitized contact voltages.

The control module estimates a first number of total cells contained in the attached battery pack by subtracting a second number from a maximum number of cells, where the second number represents how many of the inter-cell electrical contacts the measurement module detects are disconnected. The control module prevents charging the attached battery pack when the measurement module detects that one of the plurality of inter-cell electrical contacts is disconnected and a product of the first number and the first voltage differs from an overall voltage of the attached battery pack by more than one of a predetermined voltage and a predetermined percentage.

The control module stores a plurality of acceptable profiles of disconnected inter-cell electrical contacts, and prevents charging the attached battery pack when the digitized contact voltages do not match one of the plurality of acceptable profiles. The control module prevents charging the attached battery pack when any two of the cell voltages differ from each other by more than one of a predetermined voltage and a predetermined percentage. The light source blinks in one of a set of predefined patterns when charging is prevented.

A battery charger comprises a first electrical contact that receives a positive contact of an attached battery pack; a second electrical contact that receives a negative contact of the attached battery pack; a plurality of inter-cell electrical contacts that selectively receive inter-cell contacts of the attached battery pack; a measurement module; and a control module. The inter-cell contacts of the attached battery pack are connected to nodes between cells of the attached battery pack.

The measurement module selectively measures contact voltages of the first and second electrical contacts and the plurality of inter-cell electrical contacts. The control module estimates a first number of total cells contained in the attached battery pack and prevents charging the attached battery pack when the measurement module detects that one of the plurality of inter-cell electrical contacts is disconnected and a product of the first number and the first voltage is not approximately equal to an overall voltage of the attached battery pack.

In other features, the control module prevents charging the attached battery pack when the measurement module detects that one of the plurality of inter-cell electrical contacts is disconnected and the product differs from the overall voltage by more than one of a predetermined voltage and a predetermined percentage. The control module estimates the first number by subtracting a second number from a maximum number of cells. The second number represents how many of the inter-cell electrical contacts the measurement module detects are disconnected.

In further features, the measurement module comprises a multiplexer that outputs a selected one of the contact voltages. The measurement module comprises a multiplexer that outputs a selected pair of the contact voltages. The measurement module comprises an analog to digital converter that digitizes the contact voltages. The battery charger further comprises a display that displays an error when charging is prevented. The display includes a light source that blinks in a predefined pattern corresponding to the error.

In still other features, the control module stores a plurality of acceptable profiles of disconnected inter-cell electrical contacts. The control module prevents charging the attached battery pack when the contact voltages of the inter-cell contacts do not match one of the plurality of acceptable profiles.

The measurement module measures cell voltages across each of the cells of the attached battery pack. The control module prevents charging the attached battery pack when the cell voltages differ from each other by more than a predetermined amount. The control module prevents charging the attached battery pack when any two of the cell voltages differ from each other by more than one of a predetermined voltage and a predetermined percentage.

A battery charger comprises a first electrical contact that receives a positive contact of an attached battery pack; a second electrical contact that receives a negative contact of the attached battery pack; a plurality of inter-cell electrical contacts that selectively receive inter-cell contacts of the attached battery pack; a measurement module; and a control module. The inter-cell contacts of the attached battery pack are connected to nodes between cells of the attached battery pack. The measurement module selectively measures contact voltages of the first and second electrical contacts and the plurality of inter-cell electrical contacts. The control module prevents charging the attached battery pack when the measurement module detects that one of the plurality of inter-cell electrical contacts is disconnected.

In other features, the control module estimates a first number of total cells contained in the attached battery pack by subtracting a second number from a maximum number of cells. The second number represents how many of the inter-cell electrical contacts share a voltage with others of the inter-cell electrical contacts and the first and second electrical contacts. The second electrical contact is connected to a reference potential, and the control module estimates a first number of total cells contained in the attached battery pack by subtracting a second number from a maximum number of cells. The second number represents how many of the inter-cell electrical contacts are at the reference potential. The reference potential is ground.

In other features, the measurement module comprises a multiplexer that outputs a selected one of the contact voltages. The measurement module comprises an analog to digital converter that digitizes the contact voltages. The battery charger further comprises a display that displays an error when charging is prevented. The display includes a light source that blinks in a predefined pattern corresponding to the error. The measurement module measures cell voltages across each of the cells of the attached battery pack. The control module prevents charging the attached battery pack when the cell voltages differ from each other by more than a predetermined amount. The control module prevents charging the attached battery pack when any two of the cell voltages differ from each other by more than one of a predetermined voltage and a predetermined percentage.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 2B:
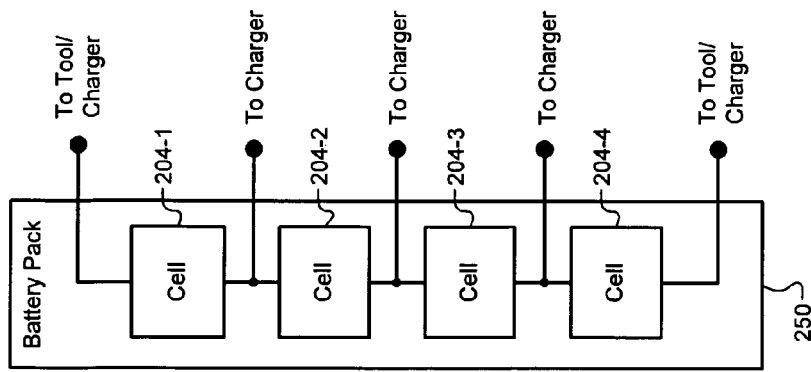
FIG. 2B is a functional block diagram of a simplified battery pack according to the principles of the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Figure 2A:
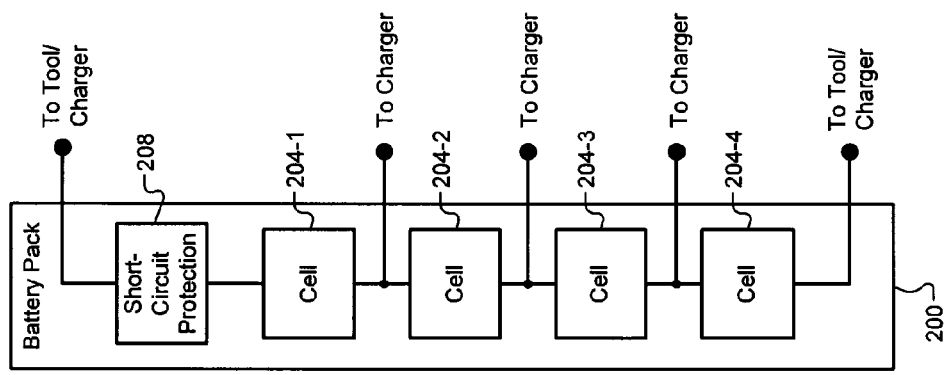
FIG. 2A is a functional block diagram of a battery pack having inter-cell contacts according to the principles of the present disclosure.
Figure 1:
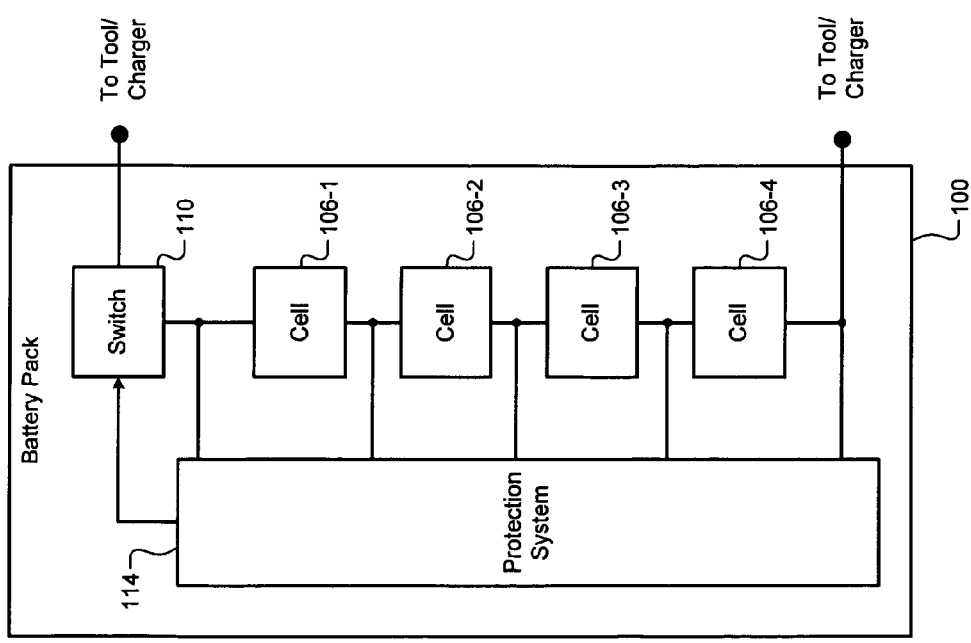
FIG. 1 is a functional block diagram of a battery pack according to the prior art.

Referring now to FIG. 2A, a functional block diagram of a battery pack 200 having inter-cell contacts according to the principles of the present disclosure is presented. The battery pack 200 is shown with four cells 204-1, 204-2, 204-3, and 204-4, though more or fewer may be included. Each of the cells 204 has a positive terminal and a negative terminal, and the cells 204 are connected in series. For purposes of illustration, the cells 204 will be described as having the positive terminal on top and the negative terminal on the bottom.

Each of the terminals of the cells 204 is connected to an external contact of the battery pack 200. The connected terminals of adjacent cells may share a single contact. For example, the positive terminal of the cell 204-2 may share a contact with the negative terminal of the cell 204-1. The battery pack 200 has a top contact, a bottom contact, and one or more inter-cell contacts. Three inter-cell contacts are shown in FIG. 2A for purposes of illustration only.

When the battery pack 200 is placed in a tool, the top and bottom contacts of the battery pack 200 may be used to provide power to the tool. The three inter-cell contacts, connected to the positive terminals of the cells 204-2, 204-3, and 204-4, may not be electrically connected to the tool. Instead, these contacts may be used by a battery charger so that the battery charger can access each of the cells 204 individually.

A short-circuit protection module 208 may be located between the positive terminal of the cell 204-1 and the top contact of the battery pack 200. Alternatively, the short-circuit protection module 208 may be located between the negative terminal of the cell 204-4 and the bottom contact. The short-circuit protection module 208 may stop conducting when a current through the short-circuit protection module 208 exceeds a predetermined level for a predetermined period of time. The short-circuit protection module 208 may be reset manually through the battery pack 200, manually through the battery charger, automatically by the battery charger, and/or automatically after a second predetermined period of time. Alternatively, an element of the short-circuit protection module 208, such as a fuse, may be replaced.

Battery packs with different numbers of cells may be interchangeable in a battery-operated system that includes one or more tools and a battery charger. The battery packs may therefore have the same physical connector shape—i.e., a standard interface. The top and bottom contacts of the battery packs may remain in the same place in the standard interface, so that the tools only need two contacts to receive the full voltage from any attached battery pack. This allows for an array of battery pack sizes, weights, capacities, and costs to be accommodated by the standard interface across a common set of tools and a battery charger.

The location and number of the inter-cell contacts in the standard interface may be determined by the battery pack having the greatest number of cells. The battery charger will have a corresponding number of inter-cell contacts. For example, in a system where the battery packs have as many as 6 cells, the battery charger may have a top contact, a bottom contact, and 5 inter-cell contacts. Battery packs having fewer than 6 cells may have dummy contacts for those inter-cell contacts that are not necessary. Alternatively, the extra inter-cell contacts may be connected to other internal nodes of the battery pack.

Referring now to FIG. 2B, a functional block diagram of a simplified battery pack 250 is shown. Although not shown in FIG. 2B, in various implementations the battery pack 250 may include short-circuit protection, charging protection, and temperature sensing. Short-circuit protection may be implemented as shown in FIG. 2A. Temperature sensing may be performed using a two-conductor device, such as a thermocouple. One of the conductors may be connected to one of the contacts of the battery pack 250, while the other conductor may require another contact.

In various implementations, different current paths may be provided for charging and tool usage. For example only, it may be desirable for the battery charger to allow large currents to quickly charge or discharge the battery pack 250. However, for a tool, this large current would be an indication of a short-circuit fault.

A short-circuit protection module may protect the tool usage path, while a charging protection module protects the charging path. The charging protection module may allow larger currents to flow than does short-circuit protection. The charging path may be connected to one contact for interfacing with the battery charger, while the tool usage path may be connected to another contact for interfacing with tools.

In brief, FIGS. 3A-3D and 4A-4B are functional block diagrams of exemplary charging systems according to the principles of the present disclosure. In various implementations, a battery charger may be able to accommodate battery packs with more or fewer numbers of cells. For example only, a battery charger may be able to charge battery packs having between 3 and 6 cells.

For purposes of illustration only, the battery chargers shown in FIGS. 3A-4B can charge batteries having 2, 3, or 4 cells. Battery packs may be configured with the same top and bottom contacts whether they contain 2, 3, or 4 cells. In this way, the connection between the battery pack and a tool will use the same two contacts regardless of the number of cells in the battery pack.

When the battery pack is connected to the battery charger, the battery charger determines how many cells are in the battery pack based upon the voltages detected at the inter-cell contacts. For example, in FIG. 3A, a 4-cell battery pack is connected to the battery charger. Because the battery pack has four cells, a voltage will be present on all three of the inter-cell contacts. In this way, the battery charger knows that a 4-cell battery pack has been connected.

Figure 3A:
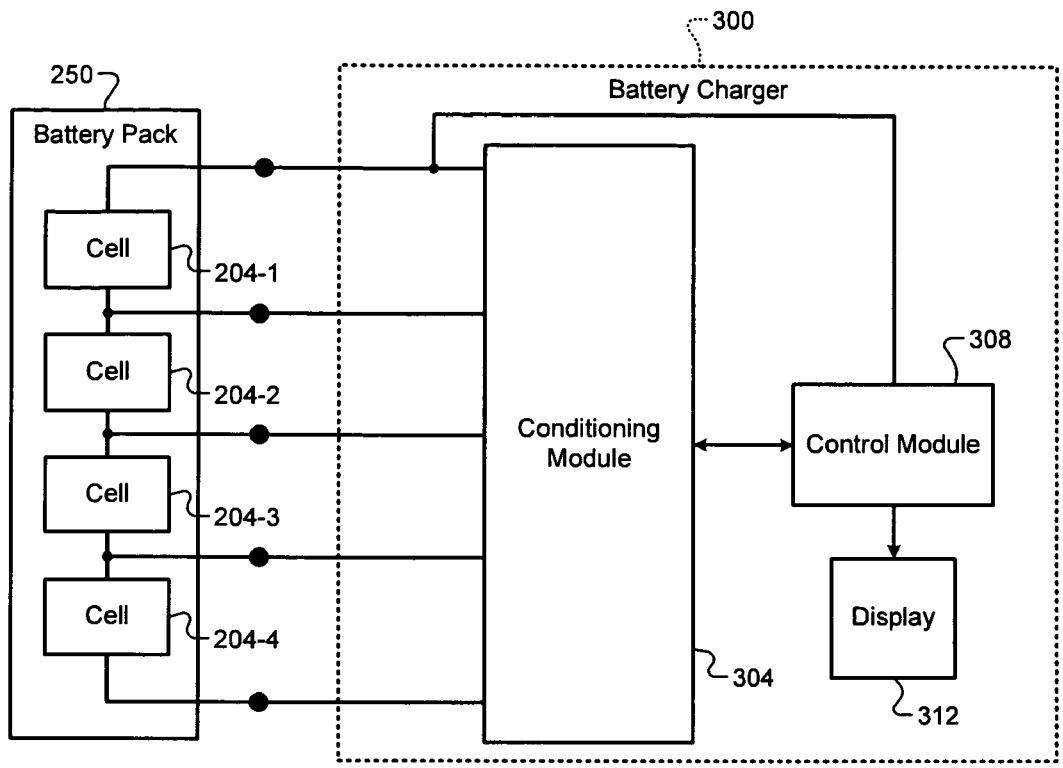
FIGS. 3A-3F are functional block diagrams of battery systems including a battery charger and a battery pack according to the principles of the present disclosure, where battery packs in the system have up to 4 cells.
Figure 3B:
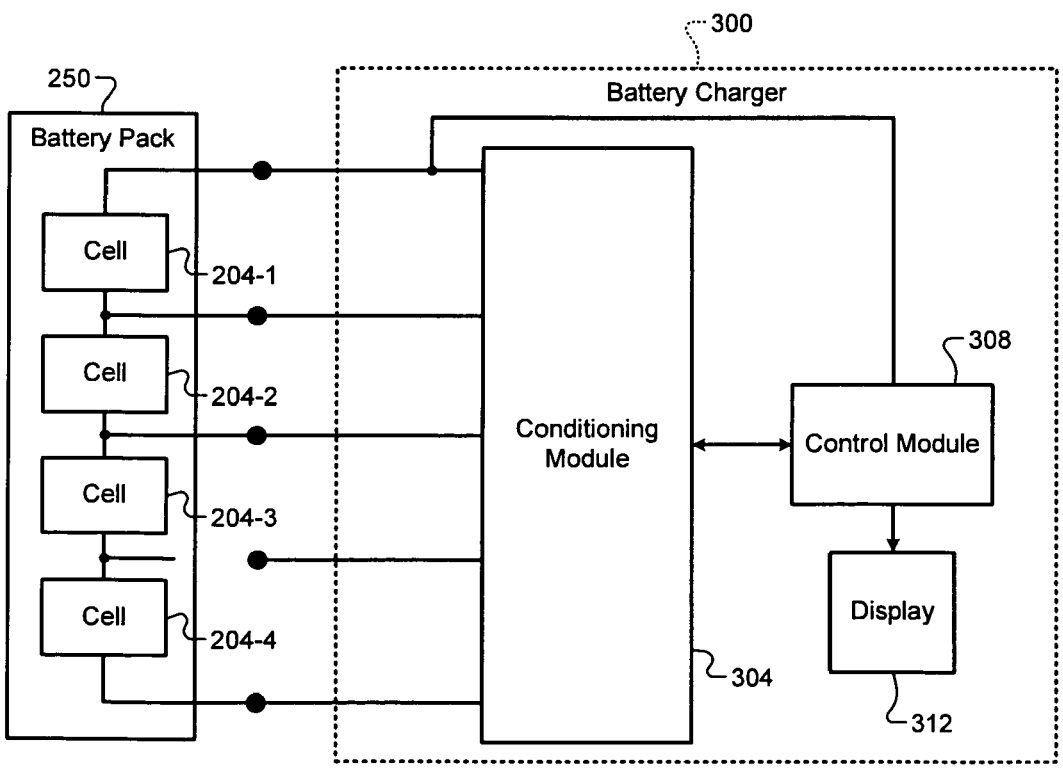

In FIG. 3B, a 4-cell battery pack with a broken contact is shown connected to the battery charger. When the battery charger cannot access each cell individually, the battery charger may avoid charging such a battery pack. The battery charger may display an error indication, such as by blinking a sequence of lights.

Figure 3C:
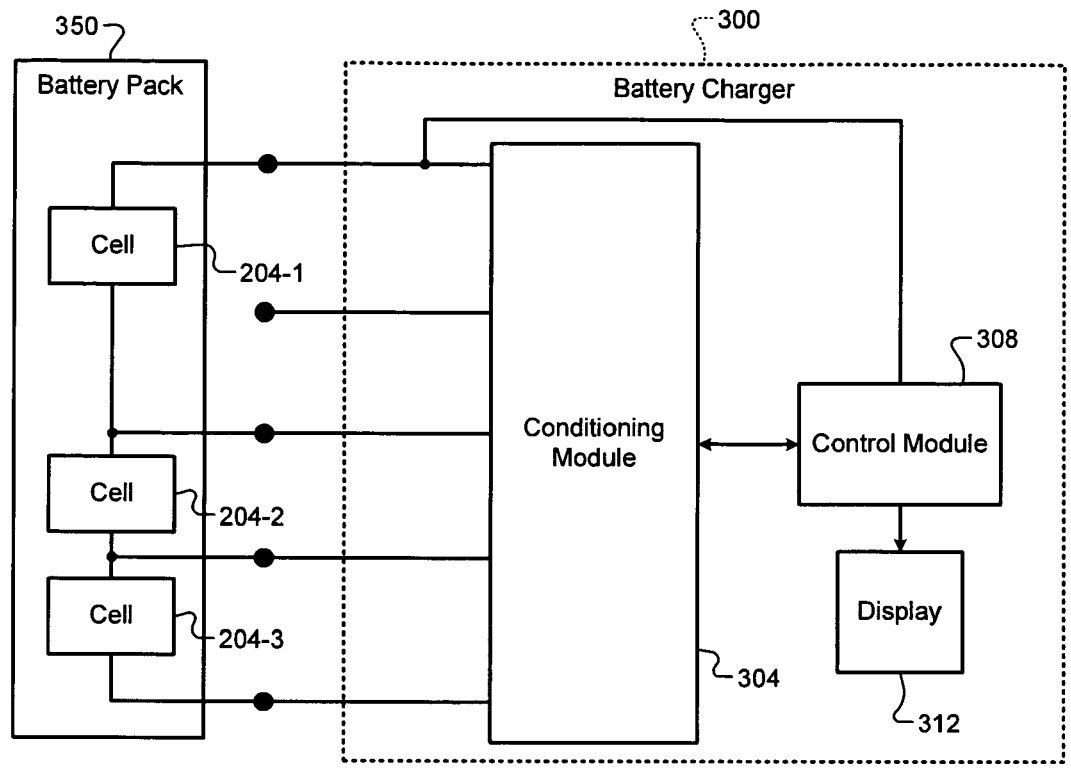

In FIG. 3C, a 3-cell battery pack is shown connected to the battery charger. The battery charger recognizes that the battery pack has three cells because a voltage is detected on only the bottom two of the inter-cell contacts. In various implementations, the disconnected inter-cell contact for a 3-cell battery pack may instead be the bottom or the middle inter-cell contact.

Figure 3D:
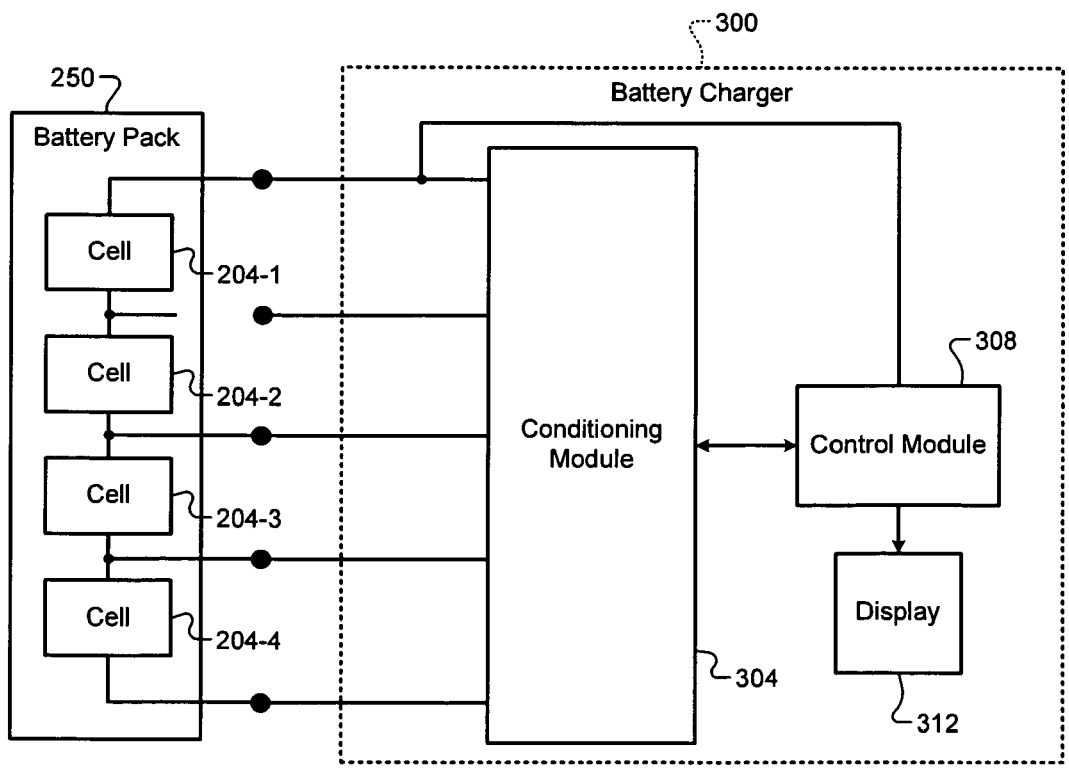

In FIG. 3D, a 4-cell battery pack may be misidentified as a 3-cell battery pack when the top inter-cell contact is broken or otherwise not electrically conductive. Unlike the situation in FIG. 3B, the broken contact of FIG. 3D might be the result of a 2- or 3-cell battery pack being attached. In order to distinguish between these situations, the battery charger may measure the voltage of a single cell and multiply it by the number of detected cells. If the voltage product is less than the overall battery pack voltage, as would be the case in FIG. 3D, there is likely a broken contact.

Alternatively, the overall battery pack voltage may be divided by the number of detected cells and compared to the voltage of a single cell. Because these calculations assume that the cell voltages are approximately equal, a false positive for a broken contact may occur when cell voltages differ significantly within the battery pack. In such cases, the total battery pack voltage may not be equal to the number of cells times the voltage of a single cell.

Figure 3E:
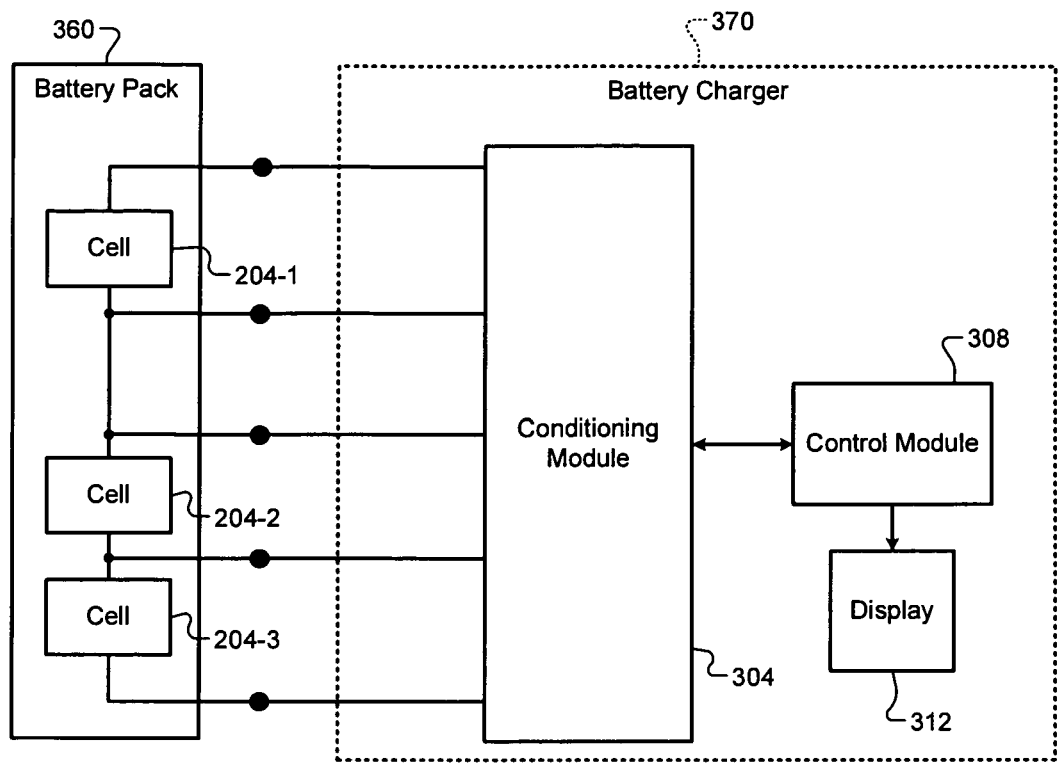
Figure 3F:
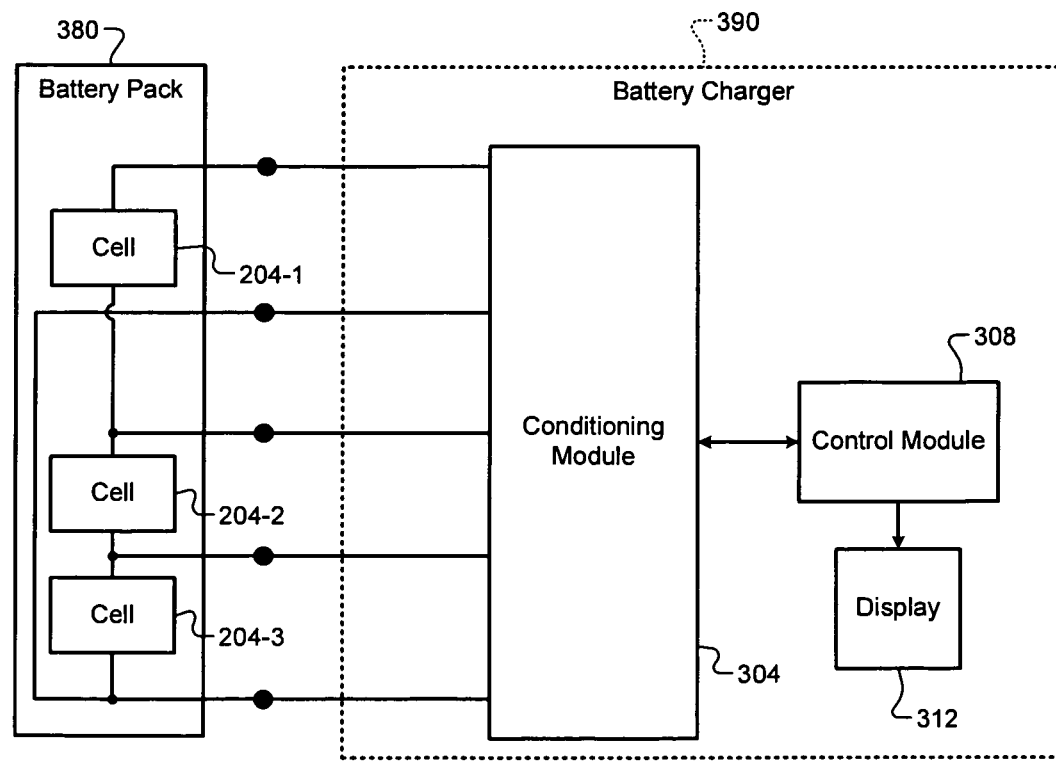

When the cell voltages differ this much, it may be an indication that one or more of the cells are deteriorating. Diagnosing this deteriorated cell as a broken contact, and suspending charging, may therefore be beneficial, as a deteriorated cell may over-discharge during use in a tool. FIGS. 3E and 3F depict alternative battery pack configurations when fewer than 4 cells are present. By connecting each external contact to an internal voltage, broken contacts may be reliably diagnosed whenever any contact of the battery charger does not detect a voltage.

The number of cells can then be determined by the number of battery pack contacts that are at the same voltage. Every pair of contacts that is at the same voltage represents one fewer cell. For example, as shown in FIGS. 3E and 3F, one pair of contacts of the battery pack will have the same voltage, indicating that there are three cells—one fewer cell than the maximum number, four.

Referring now to FIG. 3A, a battery charging system includes the battery pack 250 and a battery charger 300. The battery charger 300 includes a conditioning module 304, a control module 308, and a display 312. The conditioning module 304 connects to the positive and negative terminals of each of the cells 204 of the battery pack 250 via the external contacts of the battery pack 250. The conditioning module 304 may measure the voltages across each of the cells 204 and across the overall battery pack 250.

The conditioning module 304 may provide these measurements to the control module 308, and may convert them to digital before transmitting them to the control module 308. The control module 308 is shown having a connection to the top contact from the battery pack 250. This allows the overall voltage of the battery pack 250 to be measured, assuming that the bottom contact of the battery pack 250 and the control module 308 are both referenced to a common potential, such as ground.

The control module 308 determines the number of cells in the battery pack 250, such as by detecting the top inter-cell contact that registers a voltage. The control module 308 may then measure the voltage of one of the cells 204, such as the bottom cell 204-4. The control module 308 can then multiply the voltage of the single cell by the number of detected cells and compare that to the overall voltage of the battery pack 250.

Alternatively, the control module 308 may divide the overall voltage of the battery pack 250 by the number of detected cells. The result can then be compared to the voltage of a single cell. If the quotient differs significantly from the voltage of a single cell or the product differs significantly from the voltage of the battery pack 250, the control module 308 may avoid charging the battery pack 250. The control module 308 may instruct the display 312 to display an error message. For example, the display 312 may include a light-emitting diode, which flashes a predetermined pattern corresponding to this error condition.

In various implementations, the control module 308 may store predefined profiles for each possible attached battery pack. Each of the profiles may indicate the expected voltages on each of the battery pack contacts. For example, in the context of FIG. 3A, the profiles may define which of the cells 204 will be removed to create a three-cell battery pack. For example only, if the cell 204-4 is removed, the lower inter-cell contact may be disconnected. Alternatively, the profile may specify that the lower inter-cell contact will be electrically connected to the bottom contact within the battery pack. The control module 308 can therefore determine whether the battery pack is one of the predefined acceptable configurations when the voltages measured at the contacts match one of the predefined profiles.

Referring now to FIG. 3B, a battery system including the battery pack 250 and the battery charger 300 is displayed, where the connection between one of the inter-cell terminals and the battery charger 300 is broken. The conditioning module 304 may sense that there is no voltage observed at the positive terminal of the cell 204-4 and that there is a voltage observed at the positive terminals of the cells 204-3 and 204-2. The control module 308 will then instruct the display 312 to display an error indication.

Referring now to FIG. 3C, a battery system including the battery charger 300 and a 3-cell battery pack 350 is shown. For purposes of illustration, the battery pack 350 includes the cells 204-1, 204-2, and 204-3. The conditioning module 304 does not detect a voltage at the top inter-cell contact. This means that a 3-cell battery pack is connected or that a 4-cell battery pack is connected and the top inter-cell contact has a broken electrical connection.

The conditioning module 304 measures the voltage across the cell 204-3 and/or the voltage across the cell 204-2 to the control module 308. The control module 308 may then multiply the voltage of one of the cells 204 or the average of the cells 204-2 and 204-3 by the number of cells. The product can then be compared to the overall voltage of the battery pack 350. If this comparison indicates the values are close enough, such as within a predetermined percentage, the control module 308 may initiate charging and/or other activity.

Referring now to FIG. 3D, a battery system includes the battery charger 300 connected to the battery pack 250, where the top inter-cell contact of the battery pack 250 is not electrically connected to the battery charger 300. For example only, this may occur if the battery pack contact or the battery charger contact is dirty and/or there is a loose or broken connection to one or both of the contacts.

Because the conditioning module 304 detects no voltage at the top inter-cell contact, the control module 308 assumes that the battery pack 250 contains three cells 204. The control module 308 then multiplies the voltage of one of the cells 204-3 or 204-4 by three, the number of detected cells. The product is compared to the overall voltage of the battery pack 250. Because the number of cells is actually four, the product should be less than the overall voltage of the battery pack 250. The control module 308 therefore suspends charging the battery pack 250 and may signal an error message via the display 312.

In various implementations, the conditioning module 304 may measure the voltage between the top contact of the battery pack 250 and the top inter-cell contact on which a voltage is detected. In a 3-cell battery pack, this voltage will be the voltage of one of the cells 204. However, in FIG. 3D, this voltage is the voltage across both the cells 204-1 and 204-2. This voltage is compared to the voltage of a single cell, such as the cells 204-1 or 204-2, or their average. The measured voltage will be approximately double, indicating that the attached battery pack 250 is a 4-cell battery pack with a broken contact instead of a 3-cell battery pack.

Referring now to FIG. 3E, a battery system includes a 3-cell battery pack 360 and a battery charger 370. The top inter-cell and middle inter-cell contacts of the battery pack 360 are connected to the same node between the cells 204-1 and 204-2. The conditioning module 304 of the battery charger 370 will therefore detect the same voltage at each contact. This provides positive evidence that there are three cells 204 in the battery pack 360. However, this may misidentify as a 3-cell battery pack a 4-cell battery pack where one of the cells has zero voltage.

Referring now to FIG. 3F, a battery system includes a 3-cell battery pack 380 and a battery charger 390. The top inter-cell contact of the battery pack 380 is connected to the same node as the bottom contact of the battery pack 380. This makes it less likely that a zero-voltage cell would cause a 4-cell battery pack to be identified as a 3-cell battery pack.

Figure 4A:
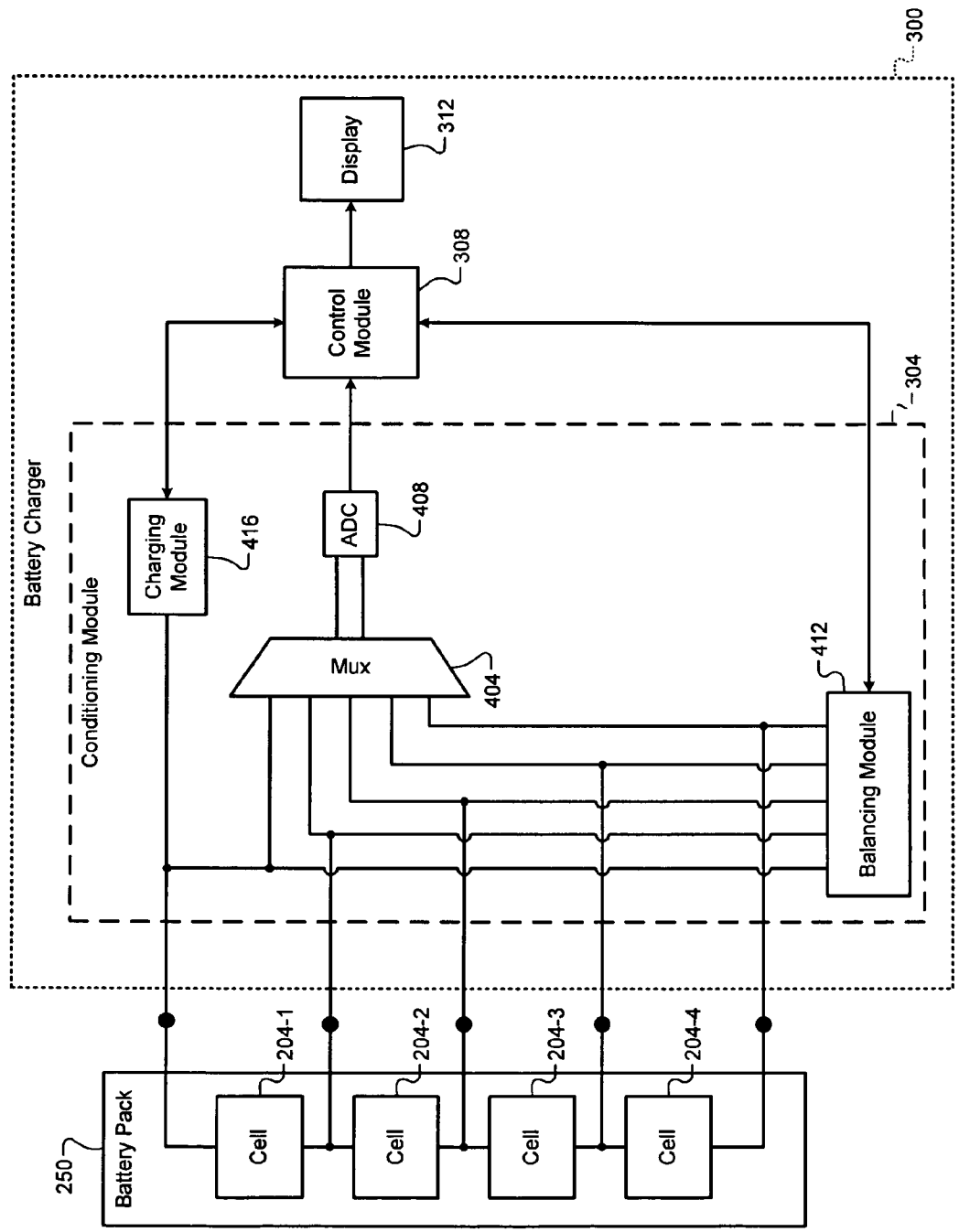
FIG. 4A is a functional block diagram of an exemplary implementation of a battery charger according to the principles of the present disclosure.

Referring now to FIG. 4A, a functional block diagram of a battery system including a battery pack 250 and an exemplary implementation of the battery charger 300 is shown. The battery charger 300 includes the conditioning module 304, the control module 308, and the display 312. The conditioning module 304 includes a multiplexer 404, an analog to digital converter (ADC) 408, a balancing module 412, and a charging module 416.

The multiplexer 404 includes five inputs, which are connected to the five contacts of the battery charger 300. The multiplexer 404 selects any two of those inputs and outputs their voltages to the ADC 408. The ADC 408 converts the voltage potential between its inputs into a digital value. The ADC 408 may include a differential amplifier. The digital value is transmitted to the control module 308.

In various implementations, the control module 308 may include analog circuitry, and the ADC 408 omitted. The control module 308 determines the number of cells in the attached battery pack. The control module 308 may then compare the product of the voltage across a single cell with the voltage of the battery pack 250.

If the multiplexer 404 outputs only adjacent contact voltages, which can be used in determining the voltage across each cell, a separate mechanism may be used for determining the overall voltage of the battery pack 250. That mechanism may involve reading the voltage of the top contact of the battery pack 250 with reference to ground, as shown by the separate line going to the control module 308, such as in FIGS. 3A-3D.

Alternatively, the multiplexer 404 may connect the top contact and the bottom contact to the inputs of the ADC 408 in order to provide this measurement. If the control module 308 determines that no non-conducting contacts or other error conditions exist, the control module 308 may initiate balancing and/or charging. The control module 308 may instruct the balancing module 412 to discharge each of the cells 204 until all of the cells 204 are at a common voltage. The control module 308 may then instruct the charging module 416 to charge the battery pack 250. The control module 308 may instruct the charging module 416 to stop charging once the voltage across any one of the cells 204 reaches a predetermined value. Therefore, during charging, the multiplexer 404 may cycle through each pair of contacts so that the voltage can be measured.

Figure 4B:
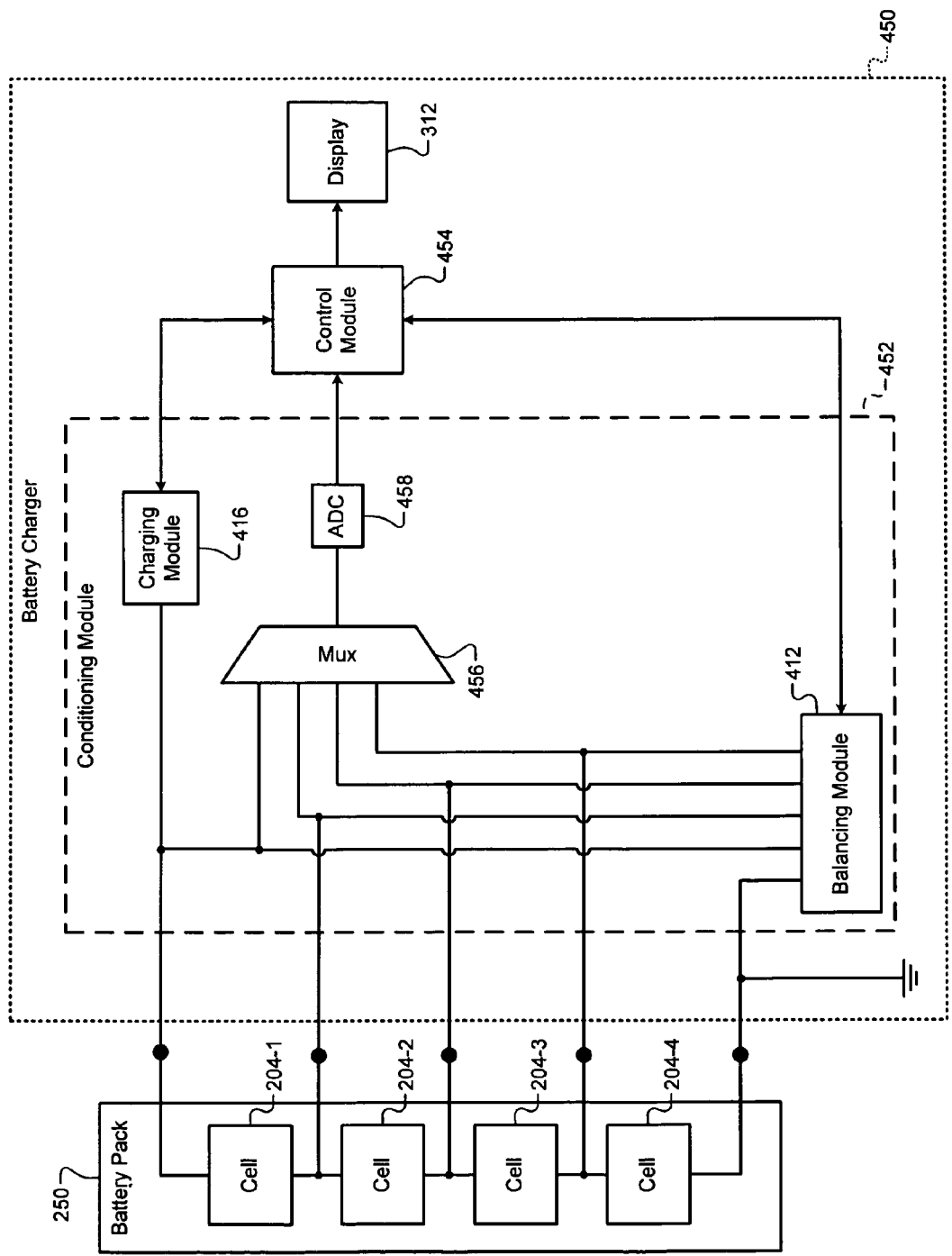
FIG. 4B is a functional block diagram of another exemplary implementation of a battery charger according to the principles of the present disclosure.

Referring now to FIG. 4B, a functional block diagram of an exemplary battery charger 450 according to the principles of the present disclosure is presented. The battery charger 450 includes a conditioning module 452, a control module 454, and the display 312. A conditioning module 452 includes a multiplexer 456, an ADC 458, the balancing module 412, and the charging module 416.

The multiplexer 456 receives four inputs, one from each of the positive terminals of the cells 204-1 through 204-4. The bottom contact of the battery pack 250 is connected to a reference potential, such as ground. The voltages at the other contacts can therefore be measured with respect to the reference potential.

The multiplexer 456 outputs a selected one of the input voltages to the ADC 458. The ADC converts the input to a digital value, which is then output to the control module 454. In order for the control module 454 to read the overall voltage of the battery pack 250, the control module 454 instructs the multiplexer 456 to select the top contact of the battery pack 250. This voltage represents the overall voltage of the battery pack 250.

The voltage of the cell 204-4 can be determined by measuring the bottom inter-cell contact, which is connected to the positive terminal of the cell 204-4. In order to determine the voltages across each of the cells 204-1 through 204-3, the control module 454 can subtract the voltage at the negative terminal of the respective cell from the voltage at its positive terminal.

Figure 5:
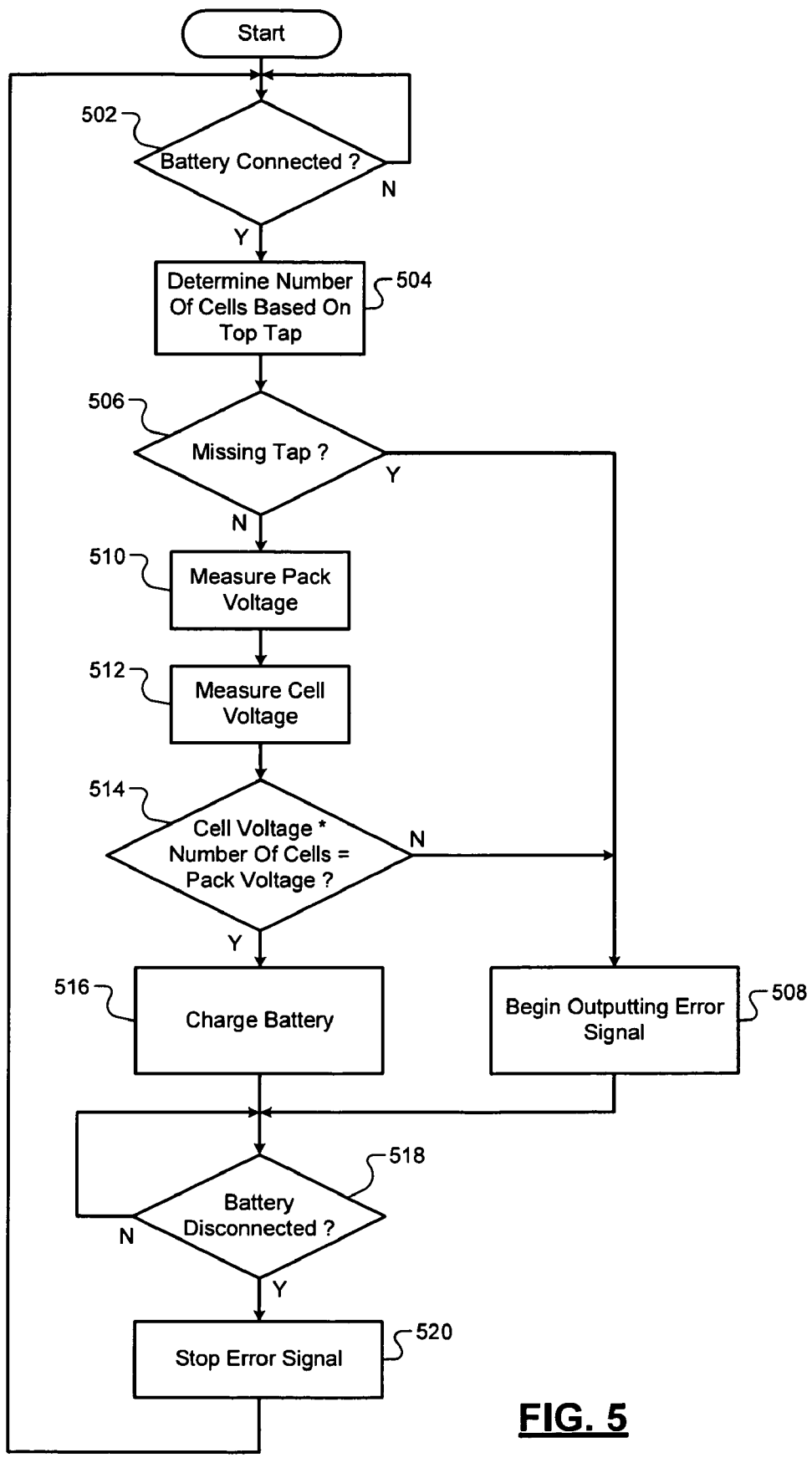
FIGS. 5 and 6 are flowcharts depicting exemplary steps performed in controlling a battery charger according to the principles of the present disclosure.

Referring now to FIG. 5, a flowchart depicts exemplary steps performed by a battery charger according to the principles of the present disclosure. Control begins in step 502, where control determines whether a battery is connected. If so, control transfers to step 504; otherwise, control remains in step 502.

In step 504, control determines the number of cells in the connected battery. This number may be determined by the top inter-cell contact at which a voltage is detected. If voltages are detected at all inter-cell contacts, the attached battery pack includes the maximum number of cells. From the top down, each inter-cell contact at which a voltage is not detected indicates one fewer cell. For example, when a voltage is present at the top inter-cell contact but not at the second inter-cell contact (as shown in FIGS. 3C and 3D), the battery pack likely has three cells.

Control continues in step 506, where control determines whether one of the lower inter-cell contacts and/or the bottom or top contacts are not conducting. If so, control transfers to step 508; otherwise, control transfers to step 510. For example, the battery pack 250 in FIG. 3B has a non-conducting bottom inter-cell contact. In step 510, control measures the voltage of the battery pack.

Control continues in step 512, where control measures the voltage of a single cell. In various implementations, in step 512, control may measure the voltages of multiple cells and average those voltages. Control continues in step 514, where control compares the product of the cell voltage and the number of detected cells to the voltage of the battery pack. If these values differ by less than a predetermined amount or percentage, control continues in step 516; otherwise, control transfers to step 508.

In various implementations, in step 514, control may instead compare the quotient of the pack voltage and the number of cells with the single cell voltage. In step 508, an error signal is output. This may involve displaying the error signal once, continuously, and/or repeatedly. The error signal may include audible and/or visual indicators. For example only, one or more light emitting diodes may be used to indicate the error signal. The error signal may continue being outputted as control continues in step 518.

In step 516, control charges the battery, if necessary. Charging the battery may involve balancing the cells of the battery. Balancing the cells may include measuring the voltage across each of the cells and applying a load across each cell until the voltages reach a common value. This process may be repeated across each of the cells present in the battery pack. If a contact is broken, measuring the voltage and applying the load can not be performed on each cell individually. For this reason, charging may be avoided when a contact is broken. Control then continues in step 518.

In step 518, control determines whether the battery pack has been disconnected. If so, control continues in step 520; otherwise, control remains in 518. In various implementations, the battery may need to be recharged if it remains connected to the charger long enough. A timer may therefore be implemented, whose expiration prompts a return to step 516. In step 520, the error signal, if still being output, is stopped. Control then returns to step 502.

Figure 6:
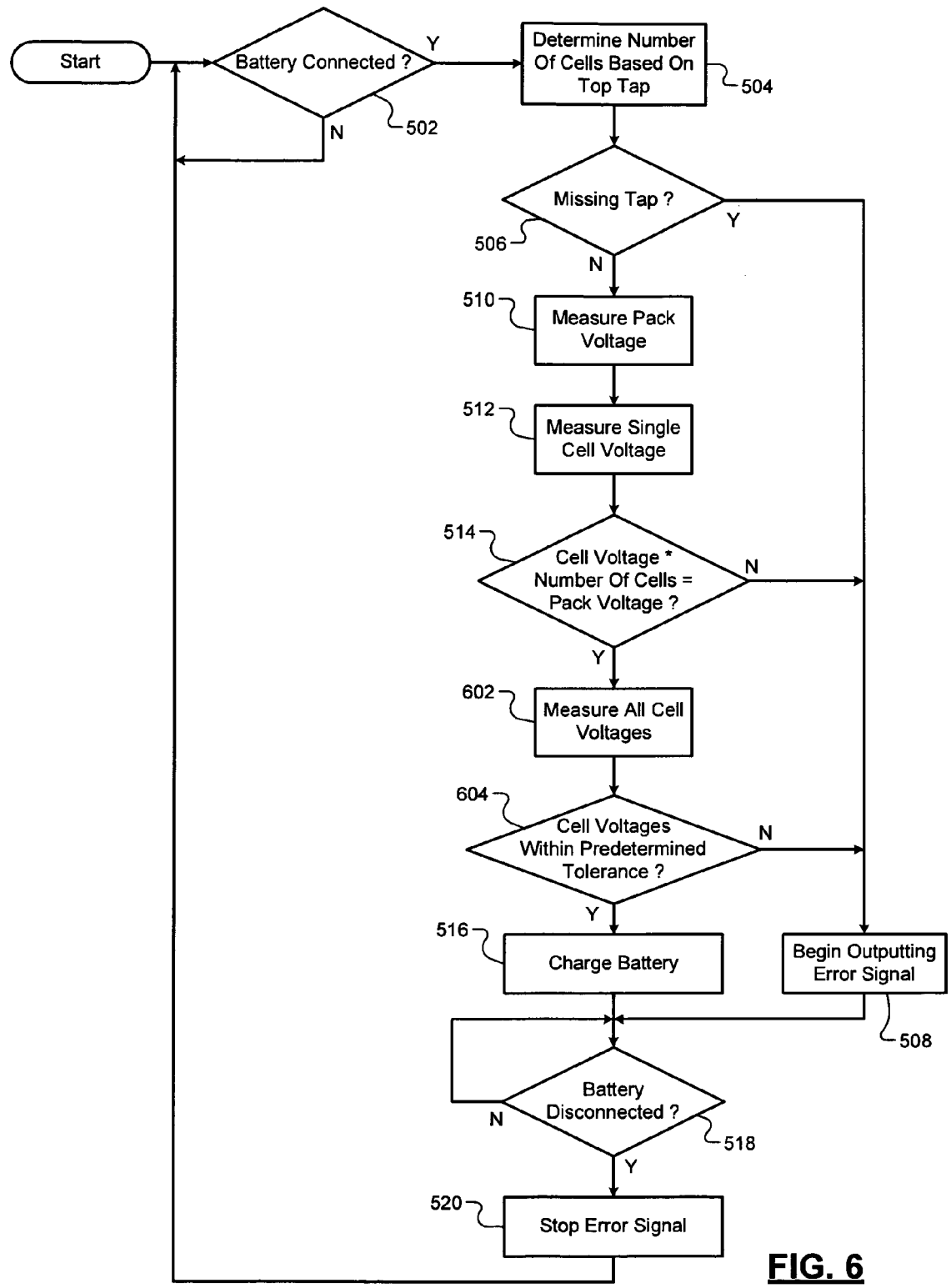

Referring now to FIG. 6, a flowchart depicts exemplary steps similar to those in FIG. 5 and including an explicit comparison of cell voltages is performed. If the product of a single cell voltage by the number of cells is approximately equal to the battery pack voltage in step 514, control transfers to step 602, where all cell voltages are measured. In various implementations, the cell voltage that was measured in step 512 may not be remeasured.

Control continues in step 604, where control determines whether the cell voltages differ from each other by less than a predetermined tolerance. For example, the predetermined tolerance may include a predetermined percentage difference between any two cell voltages. The predetermined tolerance may also include a predetermined voltage difference between any two cell voltages. Further, the predetermined tolerance may include a statistical parameter, such as standard deviation or variance.

When cell voltages differ by more than a predetermined tolerance, this may be an indication that one of the cells is weakening, and may over-discharge when the battery is used in a tool. Suspending charging may therefore be appropriate.

If the cell voltages are within the predetermined tolerance, control continues in step 516; otherwise, control continues in step 508 where charging is not performed. In step 508, the error signal initiated may be different depending on whether step 508 was reached from step 506, step 514, or step 604.

Figure 7:
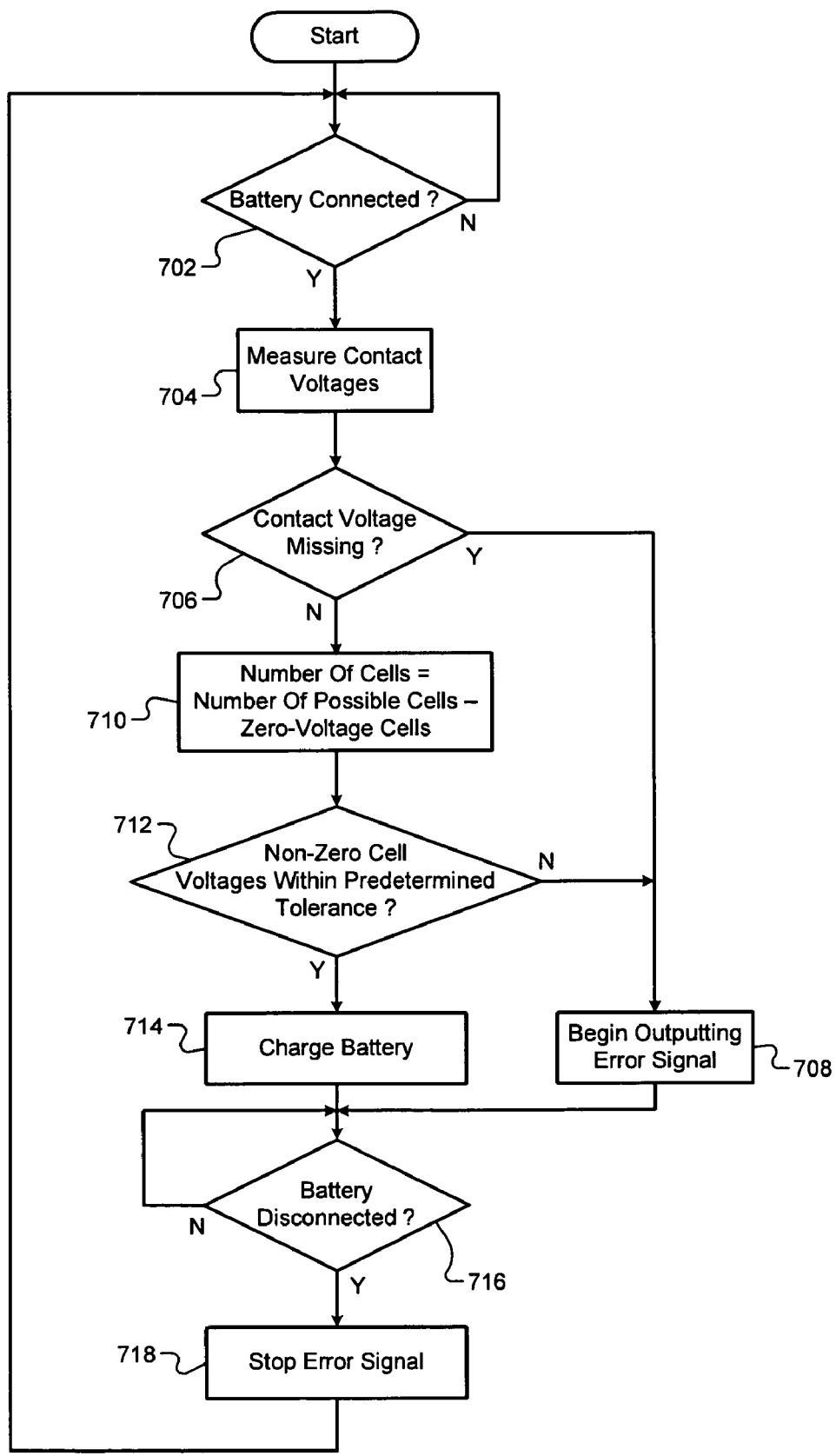
FIG. 7 is a flowchart depicting steps performed in controlling a battery charger according to the principles of the present disclosure for systems where the batteries are implemented similarly to those shown in FIGS. 3E and 3F.

Referring now to FIG. 7, a flowchart depicts exemplary steps performed by the battery chargers 370 and 390 of FIGS. 3E and 3F. For purposes of illustration only, the steps correspond to a battery charger similar to that shown in FIG. 4B, where single-ended contact voltages are measured. Control begins in step 702, where control determines whether a battery is connected to the charger. If so, control continues in step 704; otherwise, control remains in step 702.

In step 704, control measures the voltages of each of the contacts of the battery pack. Control continues in step 706, where control determines whether any one of the contact voltages is missing. For example, when a contact is broken or not electrically conducted, no voltage will be detected at that contact. If any contact voltage is missing, control transfers to step 708; otherwise, control continues in step 710.

In various implementations, in step 704, if any of the contact voltages is missing, control may skip directly to step 708 without measuring the remaining contact voltages. In step 710, the number of cells is determined by the number of possible cells in a battery pack of this system minus the number of zero-voltage cells.

A zero-voltage cell is detected when two contacts of the battery pack are connected to the same node, as shown in FIG. 3E. The term zero-voltage cell may therefore mean that, between a pair of contacts that may span a cell, zero voltage is detected, indicating that no cell is present in that location.

Alternatively, as shown in FIG. 3F, a contact of the battery pack 380 may be connected to another node inside the battery pack 380, such as the bottom contact. In this case, assuming that the bottom contact in the battery pack 380 is connected to ground, the top inter-cell contact shown in FIG. 3F will register as 0 volts. This positively identifies that cell as not present, meaning that the battery pack 380 has four minus one, or three cells.

Control continues in step 712, where control determines whether the voltages of the cells are within a predetermined tolerance. Zero voltages are excluded because they are not physical cells. Cell voltages may be determined by subtracting the contact voltage at the negative terminal of a cell from the contact voltage of the positive terminal of the cell.

If the cells are within the predetermined tolerance, control continues in step 714; otherwise, control transfers to step 708. In step 714, control begins charging the battery pack, if necessary. Control then continues in step 716. In step 708, control begins outputting an error signal. The error signal may indicate what failure has been detected, and may indicate which contact, if any, is broken. Control then continues in step 716. Control remains in step 716 until the battery pack is disconnected. Once the battery pack is disconnected, control transfers to step 718. In step 718, the error signal is stopped, if applicable, and control returns to step 702.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A battery charger comprising:
   a first electrical contact that receives a positive contact of an attached battery pack;
   a second electrical contact that receives a negative contact of the attached battery pack;
   a plurality of inter-cell electrical contacts that selectively receive inter-cell contacts of the attached battery pack, wherein the inter-cell contacts of the attached battery pack are connected to nodes between cells of the attached battery pack;
   a measurement module comprising:
      a multiplexer that connects a selected one of the first and second electrical contacts and the plurality of inter-cell electrical contacts to an output terminal;
      an analog to digital converter that receives contact voltages from the output terminal of the multiplexer and digitizes the contact voltages; and
      a voltage determination module that determines a cell voltage of each of the cells of the attached battery pack based on the digitized contact voltages; and
   a control module that:
      estimates a first number of total cells contained in the attached battery pack by subtracting a second number from a maximum number of cells, wherein the second number represents how many of the inter-cell electrical contacts the measurement module detects are disconnected;
      prevents charging the attached battery pack when the measurement module detects that one of the plurality of inter-cell electrical contacts is disconnected and a product of the first number and the first voltage differs from an overall voltage of the attached battery pack by more than one of a predetermined voltage and a predetermined percentage;
      stores a plurality of acceptable profiles of disconnected inter-cell electrical contacts and prevents charging the attached battery pack when the digitized contact voltages of the inter-cell electrical contacts do not match one of the plurality of acceptable profiles; and
      prevents charging the attached battery pack when any two of the cell voltages differ from each other by more than one of a predetermined voltage and a predetermined percentage; and
   a light source that blinks in one of a set of predefined patterns when charging is prevented.

2. A battery charger comprising:
   a first electrical contact that receives a positive contact of an attached battery pack;
   a second electrical contact that receives a negative contact of the attached battery pack;
   a plurality of inter-cell electrical contacts that selectively receive inter-cell contacts of the attached battery pack, wherein the inter-cell contacts of the attached battery pack are connected to nodes between cells of the attached battery pack;
   a measurement module that selectively measures contact voltages of the first and second electrical contacts and the plurality of inter-cell electrical contacts; and
   a control module that estimates a first number of total cells contained in the attached battery pack and that prevents charging the attached battery pack when the measurement module detects that one of the plurality of inter-cell electrical contacts is disconnected and a product of the first number and the first voltage is not approximately equal to an overall voltage of the attached battery pack.

3. The battery charger of claim 2 wherein the control module prevents charging the attached battery pack when the measurement module detects that one of the plurality of inter-cell electrical contacts is disconnected and the product differs from the overall voltage by more than one of a predetermined voltage and a predetermined percentage.

4. The battery charger of claim 3 wherein the control module estimates the first number by subtracting a second number from a maximum number of cells, wherein the second number represents how many of the inter-cell electrical contacts the measurement module detects are disconnected.

5. The battery charger of claim 2 wherein the measurement module comprises a multiplexer that outputs a selected one of the contact voltages.

6. The battery charger of claim 2 wherein the measurement module comprises a multiplexer that outputs a selected pair of the contact voltages.

7. The battery charger of claim 2 wherein the measurement module comprises an analog to digital converter that digitizes the contact voltages.

8. The battery charger of claim 2 further comprising a display that displays an error when charging is prevented.

9. The battery charger of claim 8 wherein the display includes a light source that blinks in a predefined pattern corresponding to the error.

10. The battery charger of claim 2 wherein the control module stores a plurality of acceptable profiles of disconnected inter-cell electrical contacts and prevents charging the attached battery pack when the contact voltages of the inter-cell electrical contacts do not match one of the plurality of acceptable profiles.

11. The battery charger of claim 2 wherein the measurement module measures cell voltages across each of the cells of the attached battery pack, and wherein the control module prevents charging the attached battery pack when the cell voltages differ from each other by more than a predetermined amount.

12. The battery charger of claim 11 wherein the control module prevents charging the attached battery pack when any two of the cell voltages differ from each other by more than one of a predetermined voltage and a predetermined percentage.

13. A battery charger comprising:
a first electrical contact that receives a positive contact of an attached battery pack;
a second electrical contact that receives a negative contact of the attached battery pack;
a plurality of inter-cell electrical contacts that selectively receive inter-cell contacts of the attached battery pack, wherein the inter-cell contacts of the attached battery pack are connected to nodes between cells of the attached battery pack;
a measurement module that selectively measures contact voltages of the first and second electrical contacts and the plurality of inter-cell electrical contacts; and
a control module that prevents charging the attached battery pack when the measurement module detects that one of the plurality of inter-cell electrical contacts is disconnected.

14. The battery charger of claim 13 wherein the control module estimates a first number of total cells contained in the attached battery pack by subtracting a second number from a maximum number of cells, wherein the second number represents how many of the inter-cell electrical contacts have the same voltage as another of the inter-cell electrical contacts and the first and second electrical contacts.

15. The battery charger of claim 13 wherein the second electrical contact is connected to a reference potential, and the control module estimates a first number of total cells contained in the attached battery pack by subtracting a second number from a maximum number of cells, wherein the second number represents how many of the inter-cell electrical contacts are at the reference potential.

16. The battery charger of claim 13 wherein the measurement module comprises a multiplexer that outputs a selected one of the contact voltages.

17. The battery charger of claim 13 wherein the measurement module comprises an analog to digital converter that digitizes the contact voltages.

18. The battery charger of claim 13 further comprising a display that displays an error when charging is prevented.

19. The battery charger of claim 13 wherein the measurement module measures cell voltages across each of the cells of the attached battery pack, and wherein the control module prevents charging the attached battery pack when the cell voltages differ from each other by more than a predetermined amount.

20. The battery charger of claim 19 wherein the control module prevents charging the attached battery pack when any two of the cell voltages differ from each other by more than one of a predetermined voltage and a predetermined percentage.

* * * * *